United States Patent
Chen et al.

(10) Patent No.: US 9,007,842 B2
(45) Date of Patent: Apr. 14, 2015

(54) RETENTION DETECTION AND/OR CHANNEL TRACKING POLICY IN A FLASH MEMORY BASED STORAGE SYSTEM

(71) Applicant: Seagate Technology LLC, Cupertino, CA (US)

(72) Inventors: Zhengang Chen, San Jose, CA (US); Jeremy Werner, San Jose, CA (US); Ying Quan Wu, Palo Alto, CA (US); Erich F. Haratsch, Bethlehem, PA (US)

(73) Assignee: Seagate Technology LLC, Cupertino, CA (US)

( * ) Notice: Subject to any disclaimer, the term of this patent is extended or adjusted under 35 U.S.C. 154(b) by 69 days.

(21) Appl. No.: 13/832,633

(22) Filed: Mar. 15, 2013

(65) Prior Publication Data

US 2014/0269048 A1    Sep. 18, 2014

Related U.S. Application Data

(60) Provisional application No. 61/777,048, filed on Mar. 12, 2013.

(51) Int. Cl.
*G11C 11/34* (2006.01)
*G11C 16/10* (2006.01)

(52) U.S. Cl.
CPC ..................................... *G11C 16/10* (2013.01)

(58) Field of Classification Search
USPC .............. 365/185.2, 185.03, 185.17, 185.19, 365/185.22, 185.24, 185.26, 185.29, 185.33
See application file for complete search history.

(56) References Cited

U.S. PATENT DOCUMENTS

| 8,125,827 B2 | 2/2012 | Park ........................ 365/185.09 |
| 8,281,064 B2 | 10/2012 | Oh et al. ....................... 711/103 |
| 2010/0238724 A1* | 9/2010 | Fukuda ..................... 365/185.03 |
| 2012/0236656 A1 | 9/2012 | Cometti ................... 365/185.22 |
| 2012/0239976 A1 | 9/2012 | Cometti et al. ................. 714/24 |
| 2012/0257453 A1* | 10/2012 | Shiino et al. ............ 365/185.18 |
| 2013/0003459 A1 | 1/2013 | Ulriksson et al. ........ 365/185.09 |
| 2013/0007344 A1 | 1/2013 | Belgal et al. .................. 711/103 |
| 2013/0044546 A1 | 2/2013 | Marquart ................. 365/185.18 |
| 2013/0077408 A1* | 3/2013 | Ueno ....................... 365/185.22 |
| 2013/0145162 A1* | 6/2013 | Nagai et al. ................... 713/168 |

* cited by examiner

*Primary Examiner* — Fernando Hidalgo
(74) *Attorney, Agent, or Firm* — Christopher P. Maiorana, PC

(57) ABSTRACT

A method for determining a retention time in a solid state device (SSD), comprising the steps of providing a plurality of write operations to a memory, determining a reference voltage for each of the write operations, determining a difference between (i) the reference voltage after each of the write operations and (ii) a target reference voltage and if the difference is above a predetermined value, generating a flag indicating an excessive retention has occurred.

20 Claims, 6 Drawing Sheets

VREF_ORG (ONE OR MORE VREFS TRACKED IMMEDIATELY AFTER PROGRAM, E.G., VREF_ORG_B)

VREF_CUR (ALL THE VREFS TRACKED MOST RECENTLY, E.G, VREF_CUR_A, VREF_CUR_B, VREF_CUR_C FOR MLC)

OTHER CHANNEL PARAMETERS...

RETENTION DETECTION AND/OR CHANNEL TRACKING POLICY IN A FLASH MEMORY BASED STORAGE SYSTEM

FIELD OF THE INVENTION

The invention relates to memory devices generally and, more particularly, to a method and/or apparatus for implementing a retention detection and/or channel tracking policy in a flash memory based storage system.

BACKGROUND

Conventional NAND flash memory cells use a floating gate transistor that stores data in a non-volatile fashion by holding a certain amount of electric charge in the floating gate. After a memory cell is programmed, as time goes by, the floating gate gradually loses its charge due to oxide leakage and charge detrapping. Data retention changes the distribution of threshold voltages Vt of the programmed states. Severe data retention changes can lead to read errors. In a flash memory based storage system, such as a solid state drive (SSD), it is important to avoid and/or handle errors caused by retention. Retention is a function of time and temperature. The longer the data stays in the memory without being re-written, the larger the retention effect. The higher the temperature, the larger the retention effect. Retention also becomes more pronounced as flash memory wears. As flash memory technology scales further towards sub-20 nm, and provides an increasing number of bits per cell (MLC, TLC, etc.), controlling retention becomes more challenging. For some applications, such as a SSD drive, retention time on a conventional flash memory can be longer than the maximum retention time specified by memory manufacturers.

SUMMARY

The invention concerns a method for determining a retention time in a solid state device (SSD), comprising the steps of providing a plurality of write operations to a memory, determining a reference voltage for each of the write operations, determining a difference between (i) the reference voltage after each of the write operations and (ii) a target reference voltage and if the difference is above a predetermined value, generating a flag indicating an excessive retention has occurred.

BRIEF DESCRIPTION OF THE FIGURES

Embodiments of the invention will be apparent from the following detailed description and the appended claims and drawings in which:

FIG. 5 is a chart illustrating optimal voltage references that are tracked and stored.

DETAILED DESCRIPTION OF THE PREFERRED EMBODIMENTS

Embodiments of the invention include a method and/or apparatus for providing a retention detection and channel tracking policy that may (i) be used in flash memory based storage systems, (ii) provide a signal processing based approach, (iii) be implemented without tracking time or temperature, (iv) counteract a retention effect that is PEC dependent, (v) provide a DSP based approach, (vi) be integrated with existing channel/VREF tracking procedures, (vii) be implemented with a minimal computational overhead, and/or (viii) be implemented with a low storage overhead.

Figure 1:
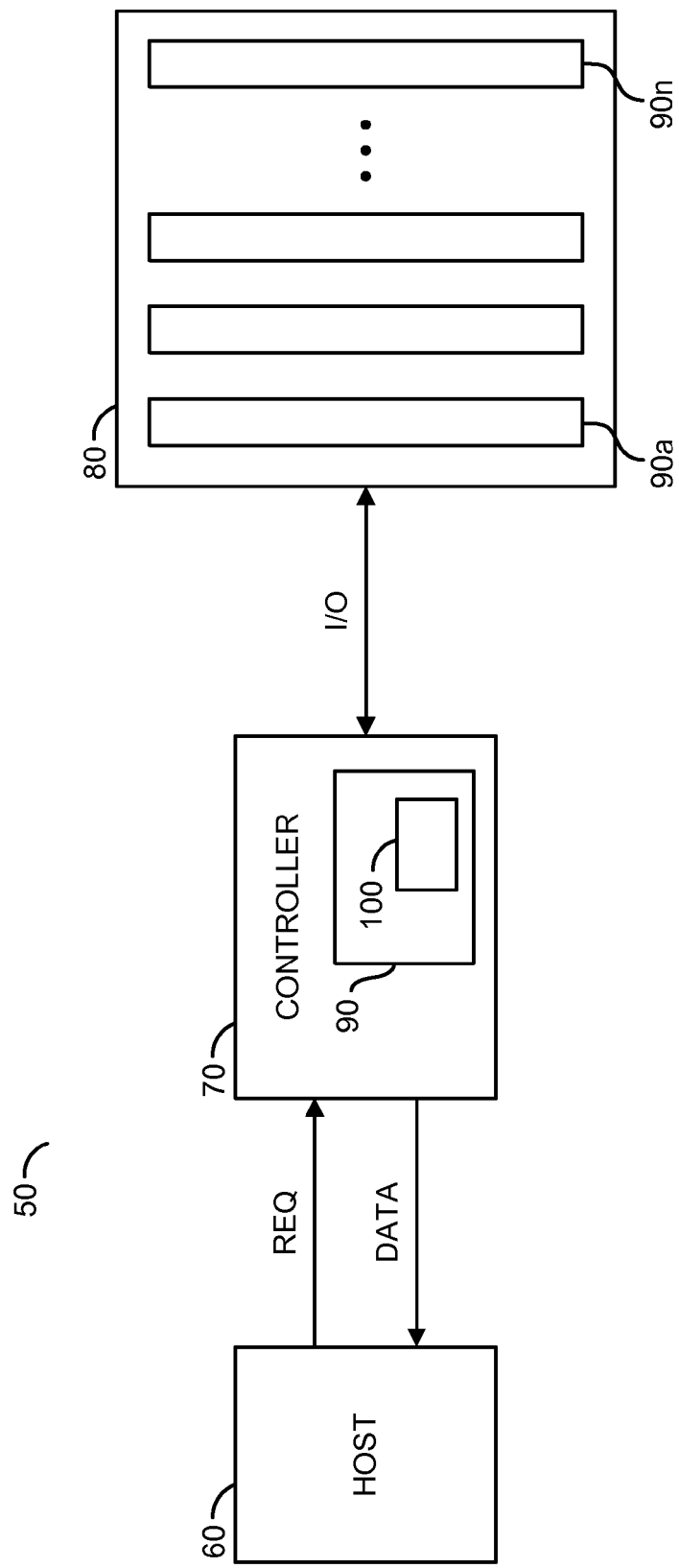
FIG. 1 is a diagram of a solid state drive.

Referring to FIG. 1, a block diagram of an example apparatus 50 is shown. The apparatus 50 generally comprises a block (or circuit) 60, a block (or circuit) 70 and a block (or circuit) 80. The circuit 70 may include a circuit 90. The circuit 90 may be a memory configured to store computer instructions (or firmware). The instructions, when executed, may perform a number of steps. The firmware 90 may include a tracking module 100 (to be described in more detail in connection with FIGS. 5 and 6).

A signal (e.g., REQ) may be generated by the circuit 60. The signal REQ may be received by the circuit 70. The signal REQ may be a request signal that may be used to access data from the circuit 80. A signal (e.g., I/O) may be generated by the circuit 70 to be presented to/from the circuit 80. The signal REQ may include one or more address bits. A signal (e.g., DATA) may be one or more data portions received by the circuit 80.

The circuit 60 is shown implemented as a host circuit. The circuit 70 reads and writes data to and from the circuit 80. The circuit 80 is generally implemented as a nonvolatile memory circuit. The circuit 80 may include a number of modules 90a-90n. The modules 90a-90n may be implemented as NAND flash chips. In some embodiments, the circuit 80 may be a NAND flash device. In other embodiments, the circuit 70 and/or the circuit 80 may be implemented as all or a portion of a solid state drive having one or more nonvolatile devices. The circuit 80 is generally operational to store data in a nonvolatile condition. When data is read from the circuit 80, the circuit 70 may access a set of data (e.g., multiple bits) identified in the signal REQ.

In some embodiments, the circuit 80 may be implemented as a single-level cell (e.g., SLC) type circuit. An SLC type circuit generally stores a single bit per memory cell (e.g., a logical 0 or 1). In other embodiments, the circuit 80 may be implemented as a multi-level cell (e.g., MLC) type circuit. An MLC type circuit is generally capable of storing multiple (e.g., two) bits per memory cell (e.g., logical 00, 01, 10 or 11). In still other embodiments, the circuit 80 may implement a triple-level cell (e.g., TLC) type circuit. A TLC circuit may be able to store multiple (e.g., three) bits per memory cell (e.g., a logical 000, 001, 010, 011, 100, 101, 110 or 111).

Embodiments of the invention provide a method for detecting long retention. A VREF/channel tracking policy tracks pre-defined values of program/erase counts (PEC). The VREF parameter is tracked immediately after a program operation is stored, and used for retention detection. During retention detection, tracking is done and the result of the value of the signal VREF is compared to the stored value of the signal VREF immediately after programming. If the drift of the voltage threshold Vt is larger than a predefined threshold, a long retention is detected. In one example, when a long retention has been detected, a flag may be set. Other types of indications to the controller 90 may be used to indicate that a long retention has been detected.

An optimal value for the signal VREF may be determined for a particular read operation. A dedicated procedure may be performed, generally called a retention test. A comparison of the value of the signal VREF may be made to the result to the value found immediately after the last erase/program operation is performed. If the signal VREF drifts down by a large amount, a long retention is detected. The retention detection leverages the results of the existing channel tracking module. An adjustment may be made on how the channel tracking procedure is triggered and/or how the optimal values of the signal VREF are stored. The adjustment may enable effective retention detection.

In general, the controller 70 may include an erase/program unit implemented in an R-block configuration. For example, multiple blocks may be read from multiple dies 90a-90n. Channel tracking of the signal VREF and/or the retention detection unit is also included in the R-block configuration. The erase/program unit may be implemented as part of the firmware 90. The channel tracking module 100 may track a distribution of the voltage threshold Vt for different states. Various channel parameters can be tracked, such as voltage threshold Vt mean, voltage threshold Vt variance, and/or optimal values of the signal VREF.

Figure 2:
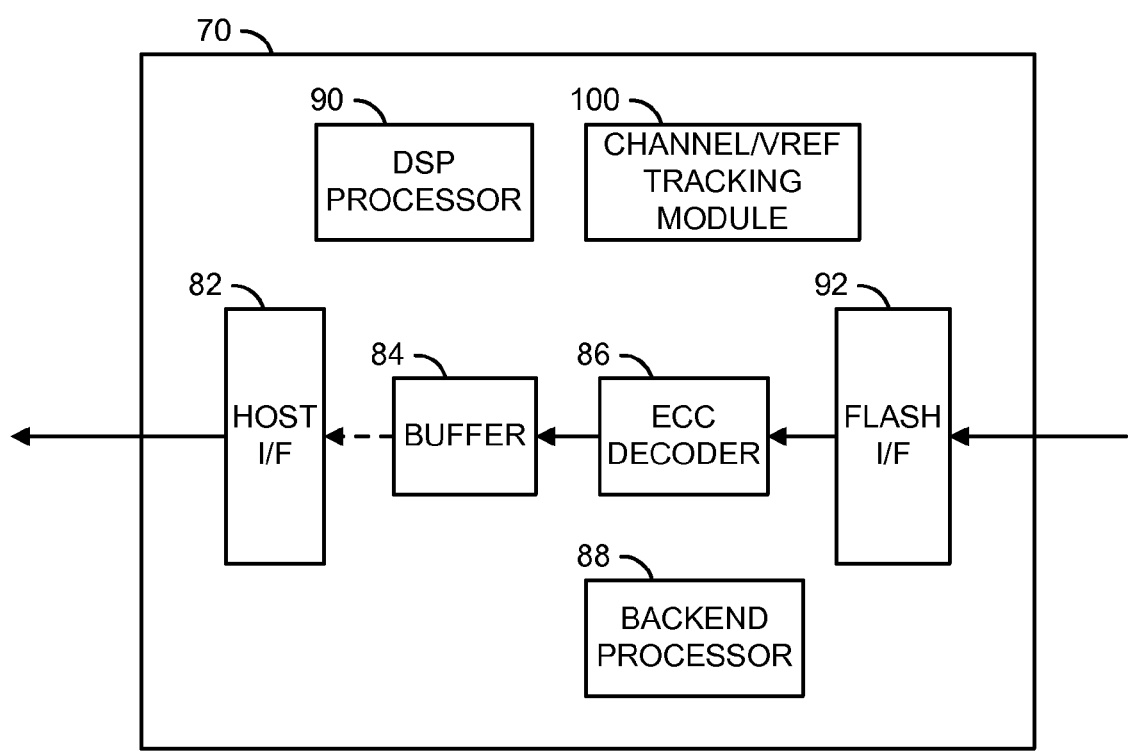
FIG. 2 is a more detailed diagram of the controller of the solid state drive of FIG. 1.

Referring to FIG. 2, a more detailed diagram of the controller 70 is shown. The controller 70 generally comprises a block (or circuit) 82, block (or circuit) 84, block (or circuit) 86, block (or circuit) 88, block (or circuit) 90, block (or circuit) 92, and a block (or circuit) 100. The circuit 82 may be implemented as a host interface. The circuit 84 may be implemented as a buffer. The circuit 86 may be implemented as a decoder, such as an error correction (ECC) decoder. The circuit 88 may be implemented as a processor, such as a backend processor. The circuit 90 may be implemented as a processor, such as a digital signal processor (DSP). The circuit 92 may be implemented as an interface circuit, such as a flash interface circuit. The circuit 100 may be implement as a channel tracking/VREF tracking module.

Figure 3:
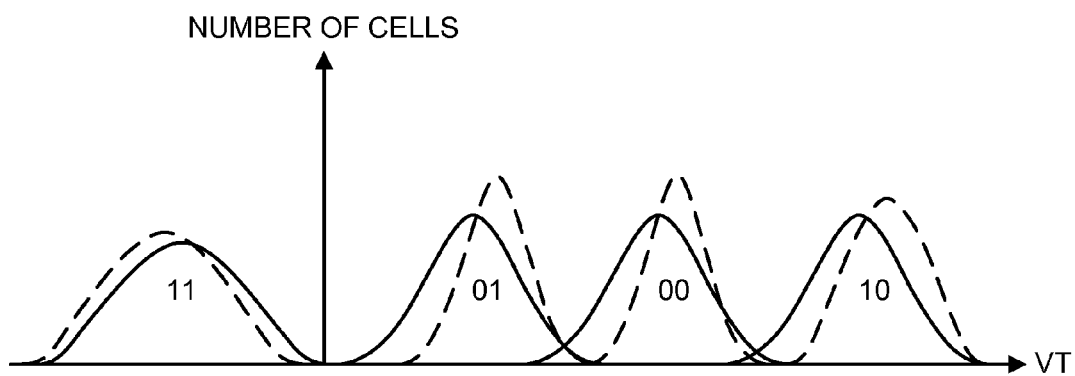
FIG. 3 is a diagram illustrating a retention effect of the voltage threshold distribution.

Referring to FIG. 3, a diagram illustrating a retention effect of a voltage threshold distribution is shown. The solid lines and the dashed lines represent the distributions of the voltage threshold Vt after and before a retention period.

Figure 4:
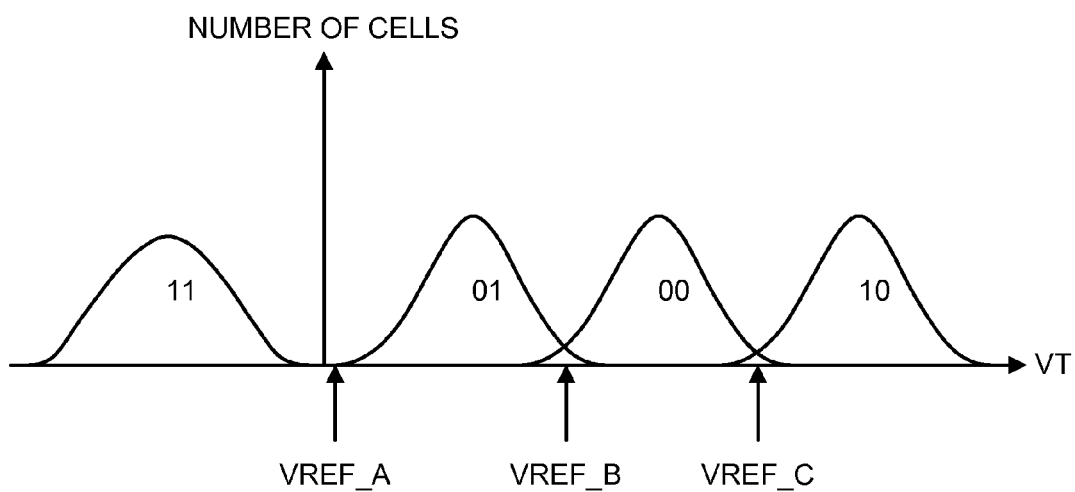
FIG. 4 is a diagram of various reference voltages used in a multilevel flash memory.

Referring to FIG. 4, a diagram showing values of the reference voltages signal VREF used in a MLC flash memory during a read operation is shown. The voltage VREF_B is used for lower page reads. The voltage VREF_A and the voltage VREF_C are used for upper page reads. The tracking module 100 finds the optimal values of the signal VREF to be used in hard-decision reads for the R-block. The particular criterion for determining an optimal value can vary to meet the design criteria of a particular implementation. The most typical criterion is to minimize the raw bit error rate. An example of a tracking process can be found in co-pending patent Ser. No. 13/464,433, the appropriate sections of which are incorporated by reference.

Since the distribution of the threshold voltage Vt changes with a number of factors (e.g., PE cycling, retention, read disturb, etc.), the optimal value for the signal VREF also changes. The tracking module 100 can choose to initiate the VREF tracking procedure whenever necessary and then store the optimal values for the signal VREF. However, for retention test purposes, access to the optimal value of the signal VREF tracked immediately after the program operation may be used.

Referring to FIG. 5, a table illustrating a format to store the value of the reference voltage parameter VREF is shown. The voltage VREF_CUR is shown representing the value of the signal VREF that is most recent for the tracked R-block. The voltage of a parameter VREF_ORG (e.g., a target reference voltage) is shown tracked immediately after programming.

In one example, the parameter VREF_ORG can be one value of the signal VREF (e.g., VREF_B) or, in another example, multiple values (e.g., VREF_B and VREF_C). The parameter VREF_ORG is a reference value used by the retention test to detect a long retention. The parameter VREF_ORG is also a reference value used by the tracking module 100 to determine whether the tracking procedure needs to be triggered. For example, a new erase/program operation may eliminate any retention and/or read disturb effect and/or potentially changes the value of the signal VREF. To trigger tracking after programming each R-block is generally inefficient. The voltage VREF_ORG of the module 100 may be used to reduce the frequency of how often the tracking procedure is invoked.

Figure 6:
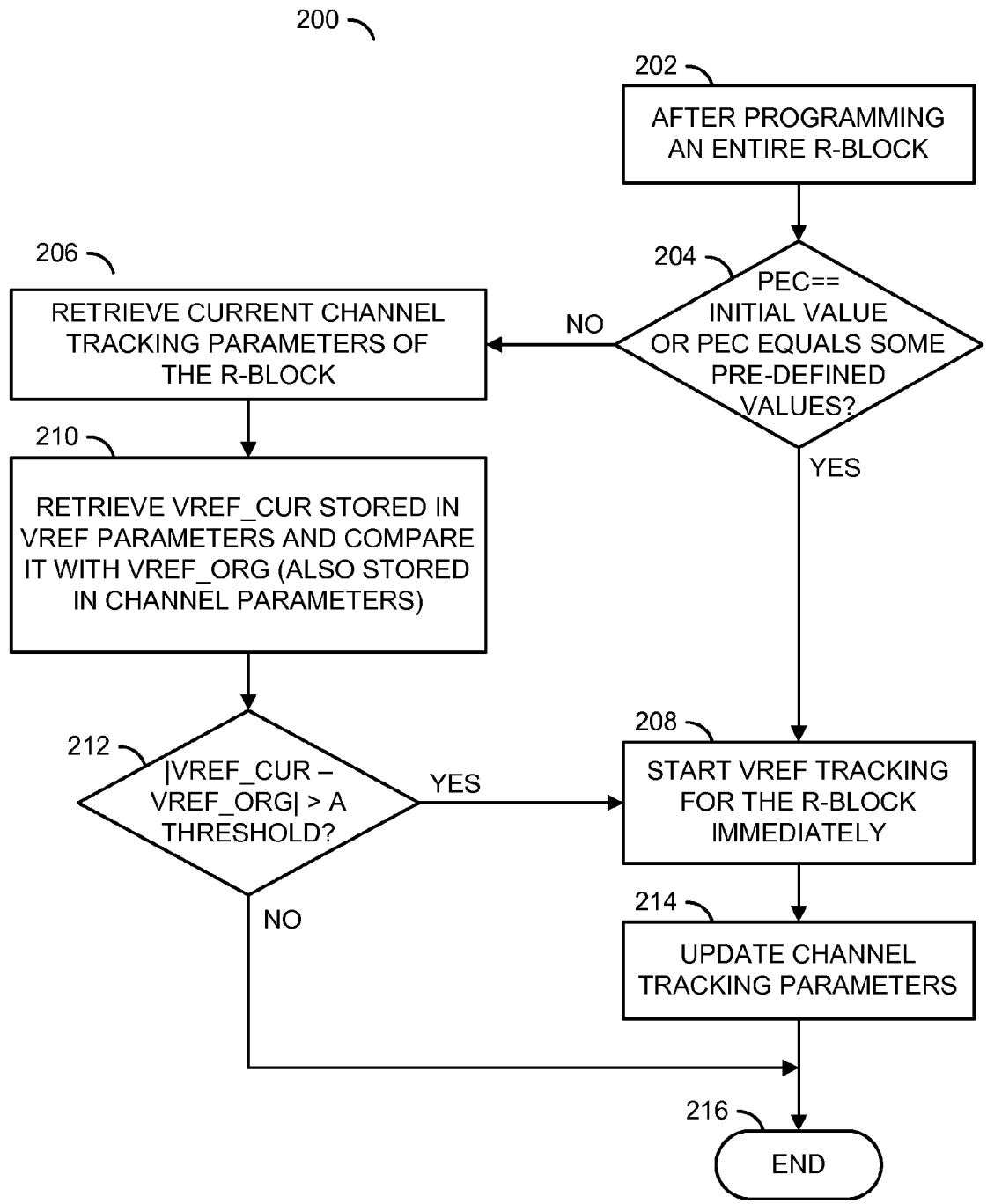
FIG. 6 is a flow diagram illustrating a policy for tracking a voltage reference after an erase/program operation.

Referring to FIG. 6, a flow diagram of a method (or process) 200 illustrating a proposed policy for VREF/channel tracking after programming an R-block is shown. The method 200 generally comprises a step (or state) 202, a decision step (or state) 204, a step (or state) 206, a step (or state) 208, a step (or state) 210, a decision step (or state) 212, a step (or state) 214, and a step (or state) 216. The state 202 may be entered after programming an entire R-block. Next, the method 200 moves to the decision state 204. The decision state 204 sets a number of values. The decision state 204 determines whether the value PEC is equal to an initial value after manufacturing (e.g., 1), or whether the value PEC equals some other pre-defined values. If not, the method 200 moves to the state 206. If so, the method 200 moves to the state 208. In the state 206, the method 200 retrieves current VREF parameters of an R-block. Next, the method 200 moves to the state 210. The state 210 retrieves the value VREF_CUR stored in the area of parameters. The state 210 compares the current value to the stored channel parameters. The state 210 compares to the value VREF_ORG. Next, the method 200 moves to the decision state 212. The decision state 212 compares an absolute value of the value VREF_CUR minus VREF_ORG. If this absolute value is greater than a threshold, then the method 200 moves to the state 208. If not, the method 200 moves to the state 216. In the state 208, the method 200 immediately starts tracking the channel for the R-block. Next, the method 200 moves to the state 214, that updates the channel parameters.

The pre-defined PEC (program/erase count) values used to trigger tracking can be based on absolute numbers, such as 100, 200, 300, . . . , or as a percentage of device life, such as 10%, 20%, 25%, 30%, . . . of the device life. The values can be equally spaced or unequally spaced throughout the life of the device.

When the PEC is not at one of a number of pre-defined values, tracking is only triggered when there is a non-trivial difference between the signal VREF_ORG and the signal VREF_CUR. The difference can be measured based on a value of the signal VREF (e.g., VREF_B) or averaged over multiple values of the signal VREF.

Figure 7:
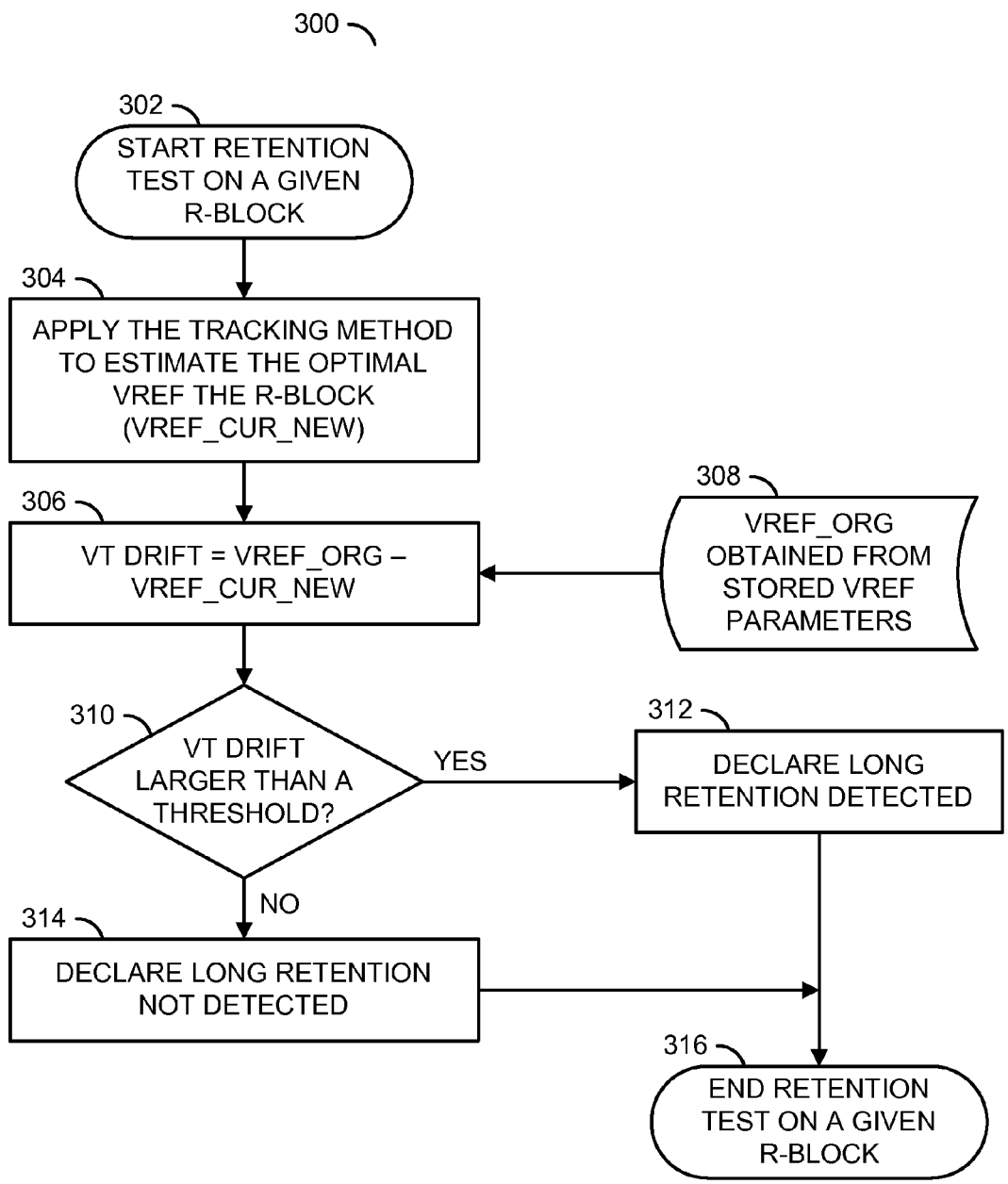
FIG. 7 is a flow diagram illustrating a retention test mode.

Referring to FIG. 7, a tracking policy (or method) 300 for the signal VREF is shown. The method 300 implements a retention test method/flow for stored parameter VREF_ORG. The method 300 generally comprises a step (or state) 302, a step (or state) 304, a step (or state) 306, a step (or state) 308, a decision step (or state) 310, a step (or state) 312, a step (or state) 314, and a step (or state) 316. The step 302 generally starts a retention test on a given R-block. Next, the state 304 applies the tracking process to estimate the optimal value VREF for the R-block. Next, the state 306 sets a value VT_DRIFT as equal to the value VREF_ORG minus the value VREF_CUR_AW. The state 308 obtains the value VREF_ORG from the stored VREF parameters. Next, the decision state 310 determines whether a drift in the voltage threshold Vt is larger than a predefined threshold. If so, the method 300 moves to the state 312. If not, the method 300 moves to the state 314. In the state 312, the method 300 declares a long retention as being detected. In the state 314, the method 300 declares a long retention as not being detected. The state 316 ends the retention test in a given block.

The retention test procedure is normally invoked on an R-block level. The tracking method 200 and/or 300 is called to obtain the current optimal value of the signal VREF (e.g., VREF_CUR_NEW) and compared against the original value of the signal VREF (e.g., VREF_ORG). To save the time spent in retention test, the controller 70 can choose to track a particular one of the values VREF (e.g., VREF_B). Storing the parameter VREF_ORG also reduces the frequency of calling tracking procedures.

The criterion for determining a long retention can be PEC independent. For example, the controller 70 can choose a "Vt drift threshold" based on various decoder requirements. At the minimum, one VREF_ORG value needs to be stored for each tracking granularity.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

The functions performed by the diagrams of FIGS. 6 and 7 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

While the invention has been particularly shown and described with reference to embodiments thereof, it will be understood by those skilled in the art that various changes in form and details may be made without departing from the scope of the invention.

The invention claimed is:

1. A method for determining a retention time in a solid state drive (SSD), comprising the steps of:
   programming a plurality of write operations to a memory;
   tracking a reference voltage for each of said write operations;
   detecting a difference between (i) said reference voltage determined after each of said write operations and (ii) an optimal reference voltage estimated for read operations from said memory after a pre-defined condition; and
   if said difference is above a pre-defined threshold, initiating a policy to counteract retention effects.

2. The method according to claim 1, further comprising the step of:
   adjusting a channel tracking procedure in response to a raw bit error rate.

3. The method according to claim 1, wherein said optimal voltage level is estimated after an erase operation.

4. The method according to claim 1, wherein said method is invoked on an R-block level of said memory.

5. The method according to claim 1, wherein said memory comprises a flash based memory.

6. The method according to claim 1, wherein said method operates without invoking time or temperature calculations.

7. The method according to claim 1, wherein said method is implemented with a channel tracking procedure of a controller of said solid state drive.

8. The method according to claim 7, wherein said method is integrated on a digital signal processor of said controller.

9. The method according to claim 1, wherein said policy comprises a retention policy operation.

10. An apparatus comprising:
    a memory configured to process a plurality of write operations; and a controller configured to (i) track a reference voltage for each of said write operations, (ii) detect a difference between (a) said reference voltage determined after each of said write operations and (b) an optimal reference voltage estimated for read operations from said memory after a pre-defined condition and (iii) if said difference is above a pre-defined threshold, initiate a policy to counteract retention effects.

11. The apparatus according to claim 10, wherein a channel tracking procedure is adjusted in response to a raw bit error rate.

12. The apparatus according to claim 10, wherein said controller is configured to track an R-block level of said memory.

13. The apparatus according to claim 10, wherein said controller further comprises a digital signal processor implementing a channel tracking procedure.

14. The apparatus according to claim 10, wherein said optimal voltage level is estimated after an erase operation.

15. The apparatus according to claim 10, wherein said memory comprises a flash based memory.

16. The apparatus according to claim 10, wherein said policy comprises a retention policy operation.

17. The method according to claim 1, wherein said pre-defined condition is (i) a pre-defined program/erase cycle count in a first mode and (ii) a difference between (a) said reference voltage determined after each of said write operations and (b) a most recent reference voltage is greater than a threshold in a second mode.

18. The apparatus according to claim 10, wherein said pre-defined condition is (i) a pre-defined program/erase cycle count in a first mode and (ii) a difference between (a) said reference voltage determined after each of said write operations and (b) a most recent reference voltage is greater than a threshold in a second mode.

19. The apparatus according to claim 10, wherein said apparatus comprises a solid state drive (SSD).

20. An apparatus comprising:
an interface configured to process a plurality of write operations to a memory; and
a control circuit configured to (i) track a reference voltage for each of said write operations, (ii) detect a difference between (a) said reference voltage determined after each of said write operations and (b) an optimal reference voltage estimated for read operations from said memory after a pre-defined condition and (iii) if said difference is above a pre-defined threshold, initiate a policy to counteract retention effects.

* * * * *